United States Patent
Huang et al.

(10) Patent No.: US 12,245,522 B2
(45) Date of Patent: Mar. 4, 2025

(54) COHERENT QUANTUM INFORMATION SYSTEMS

(71) Applicant: Huang Family Corp., Castro Valley, CA (US)

(72) Inventors: Kevin Huang, Livermore, CA (US); Gianpaolo Carosi, Livermore, CA (US); Yaniv J. Rosen, Livermore, CA (US); Nathan Woollett, Witney (GB)

(73) Assignee: Huang Family Corporation, Dublin, CA (US)

( * ) Notice: Subject to any disclaimer, the term of this patent is extended or adjusted under 35 U.S.C. 154(b) by 380 days.

(21) Appl. No.: 17/890,215

(22) Filed: Aug. 17, 2022

(65) Prior Publication Data

US 2024/0065115 A1    Feb. 22, 2024

(51) Int. Cl.
| | |
|---|---|
| *H01L 39/22* | (2006.01) |
| *H10N 60/01* | (2023.01) |
| *H10N 60/12* | (2023.01) |
| *H10N 60/80* | (2023.01) |

(52) U.S. Cl.
CPC ......... *H10N 60/12* (2023.02); *H10N 60/0912* (2023.02); *H10N 60/805* (2023.02)

(58) Field of Classification Search
CPC ............. H10N 60/805; H10N 60/0156; H10N 60/12–126; H10N 60/0912–0941; H10N 60/85–858; H10N 60/203; H10N 60/124; G06N 10/40
See application file for complete search history.

(56) References Cited

U.S. PATENT DOCUMENTS

2022/0245501 A1    8/2022    Li et al.

FOREIGN PATENT DOCUMENTS

WO    WO-2010140400 A1 * 12/2010    ............ H01L 39/225

OTHER PUBLICATIONS

Carmine Granata, Nano Superconducting Quantum Interference device: A powerful tool for nanoscale investigations, Dec. 2015, Physics Reports Voulme 614 (Year: 2015).*
S. Diesch, P. Machon, M. Wolz, C. Surgers, D. Beckmann, W. Belzig, and E. Scheer, 'Creation of equal-spin triplet superconductivity at the Al/EuS interface'. Nat Commun 9, 5248 (2018) https://doi.org/10.1038/s41467-018-07597-w.

(Continued)

*Primary Examiner* — Shahed Ahmed
(74) *Attorney, Agent, or Firm* — Victor Huang

(57) ABSTRACT

An apparatus includes a first superconductor layer, an insulating layer, and a second superconductor layer, wherein the second superconductor layer is a spin triplet superconductor (STS) layer. In some embodiments, the first superconductor layer is also a STS layer. In some embodiments, the second superconductor layer includes UCoGe. In some embodiments, the insulating layer includes uranium oxide. In some embodiments, the uranium oxide is created by exposing the second superconductor layer to an oxidizing gas, with or without heating. In some embodiments, the first superconductor layer, the insulating layer and the second superconductor layer form a Josephson junction.

3 Claims, 4 Drawing Sheets

(56) References Cited

OTHER PUBLICATIONS

H. G. Ahmad, M. Minutillo, R. Capecelatro, A. Pal, R. Caruso, G. Passarelli, M. G. Blamire, F. Tafuri, P. Lucignano, and D. Massarotti, 'Coexistence and tuning of spin-singlet and triplet transport in spin-filter Josephson junctions' Commun Phys 5, 2 https://doi.org/10.1038/s42005-021-00783-1.

J. A. Glick, V. Aguilar, A. B. Gougam, B. M. Niedzielski, E. C. Ginrich, R. Loloee, W. P. Pratt Jr. and N. O. Birge 'Phase control in a spin-triplet SQUID' Science Advances 4 eeat9457 (2018) https://doi.org/10.1126/sciadv.aat9457.

V. P. Mineev Reentrant superconductivity in UrhGe Physical Review B 91, 014506 (2015) https://doi.org/10.1103/PhysRevB.91.014506.

B. Wu, D. Aoki, and J-P. Brison 'Vortex liquid phase in the p-wave ferromagnetic superconductor UcoGe' Physical Review B 98, 024517 (2018) https://doi.org/10.1103/PhysRevB.98.024517.

W. Qin, L. Li, and Z. Zhang, "Chiral topological superconductivity arising from the interplay of geometric phase and electron correlation", Nature Physics 15, 796 (2019) https://doi.org/10.1038/s41567-019-0517-5.

M. Sato and Y. Ando 'Topological superconductors: a review', Rep. Prog. Phys. 80, 076501 (2017) https://doi.org/10.1088/1361-6633/aa6ac7.

C. Kallin and J. Berlinsky 'Chiral superconductors', Rep. Prog. Phys. 79, 054502 (2016) https://doi.org/10.1088/0034-4885/79/5/054502.

A. P. Vepsalainen, A. H. Karamlou, J. L Orrell, A. S. Dogra, B. Loer, F. Vasconcelos, D. K. Kim, A. J. Melville, B. M. Niedzielski, J. L. Yoder, S. Gustavsson, J. A. Formaggio, B. A. VanDeender, and W. D. Oliver 'Impact of ionizing radiation on superconducting qubit coherence' Nature 584, 551 (2020) https://doi.org/10.1038/s41586-020-2619-8.

S. Ran, C. Eckberg, Q.-P. Ding, Y. Furukawa, T. Metz, S. R. Saha, I-L. Liu, M. Zic, H. Kim, J. Paglione, and N. P. Butch, Nearly ferromagnetic spin-triplet superconductivity Science 365, 684 (2019) https://doi.org/10.1126/science.aav8645.

D. Aoki, A. Nakamura, F. Honda, DeXin Li, Y. Homa, Y. Shimizu, Y. J. Sato, G. Knebel, J-P. Brison, A. Pourret, D. Braithwaite, G. Lapertot, Q. Niu, M. Valiska, H. Harima, and J. Floquet, Spin-Triplet Superconductivity in UTe2 and Ferromagnetic Superconductors, JPS Conf. Proc. 30, 011065 (2020) https://doi/10.7566/JPSCP.30.011065.

\* cited by examiner

COHERENT QUANTUM INFORMATION SYSTEMS

GOVERNMENT LICENSE RIGHTS

This invention was made with government support under contract number DE-AC52-07NA27344 awarded by the United States Department of Energy. The United States government has certain rights in the invention.

TECHNICAL FIELD

Aspects of the present disclosure relate to the field of quantum information systems and superconducting devices, and more specifically to coherent quantum devices.

BACKGROUND

Superconducting circuits are increasingly being used in quantum information systems, including as a leading method for storing quantum bits of information, or qubits. Superconducting qubits show several advantages over other forms of qubits, including fast gate times and ease of control. However, superconducting-based qubits lose energy to the surrounding environment quickly and have low coherence times compared to competing technology. Coherence times refer to how long the qubits can store quantum information, and low coherence times result in shorter "memories" of qubits.

Decreasing the energy loss in superconducting circuits is an active field of research and development. Recent advances in coherence times have been due to improved circuit design and reducing the number of material defects, through advances in manufacturing technology or decreasing the size of the circuit. However, most superconducting circuits still rely on the same conventional superconductors discovered over 70 years ago. New superconducting materials that reduce energy loss are needed to advance the field of quantum information systems, and there are few promising candidates. One such candidate is topological superconductivity, which has been predicted to completely solve the energy loss issue plaguing quantum information systems. However, after over 20 years of research, a topological superconductor with the desired properties has yet to be discovered.

SUMMARY

The present invention can be used to improve the coherence and performance of quantum information systems. In particular, the present invention can be used to increase the coherence time of superconducting-based qubits.

Current superconducting circuits typically employ aluminum or other spin-single superconductors that lose energy to the surrounding environment through multiple channels, including, among others, two level systems or unpaired spins on a surface. The present invention use spin-triplet superconductors (STS). Electrons in a STS are spin-polarized, meaning that all the electron spins are, and want to stay, aligned parallel with one another.

BRIEF DESCRIPTION OF THE DRAWINGS

The described embodiments and the advantages thereof may best be understood by reference to the following description taken in conjunction with the accompanying drawings.

These drawings in no way limit any changes in form and detail that may be made to the described embodiments by one skilled in the art without departing from the spirit and scope of the described embodiments.

DETAILED DESCRIPTION

In various embodiments, a STS is used as a superconducting device in a quantum information system. For example, in a Josephson junction, a STS can be a first superconducting layer, followed by an insulating or dielectric (second) layer, and followed by another STS in a third layer. Henceforth, the term "insulating layer" should be understood to include "insulating layer" or "dielectric layer" unless explicitly stated otherwise. The thickness of the insulating layer can vary. For example, in some embodiments, the insulating layer can be between 1.0 nm and 2.0 nm thick. In some embodiments, the insulating layer can be between 0.5 nm and 5.0 nm thick. The STS in the first layer can be the same type of STS in the third layer. This STS Josephson junction can be used to create a superconducting qubit and, in some embodiments, magnetic fields where the STS is/are superconducting.

Figure 1:
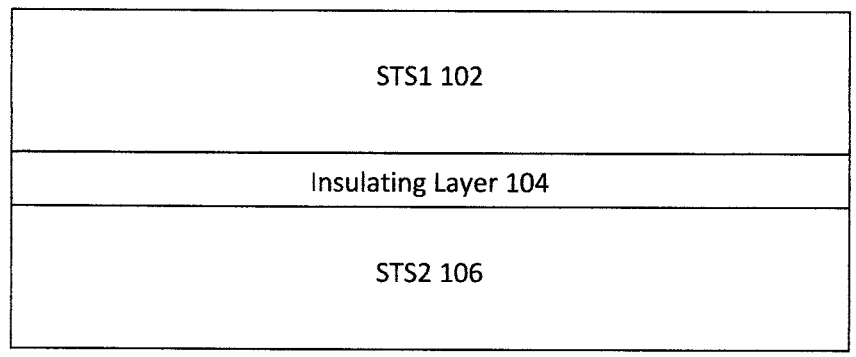
FIG. 1 is a diagram that illustrates an example Josephson junction in accordance with some embodiments of the present disclosure.

FIG. 1 illustrates a Josephson junction in accordance with some embodiments. In Josephson Junction 100, STS1 102 is the top layer, followed by Insulating Layer 104, and followed by STS2 106. In some embodiments, STS1 102 and STS2 106 are the same STS (i.e. both are comprised of UCoGe). In some embodiments, Insulating Layer 104 is uranium oxide. In some embodiments, a uranium oxide layer can be created by exposing STS1 102 and STS2 106 to air, much like how current aluminum-based superconducting qubits expose aluminum to air to create an insulating aluminum oxide layer between the two aluminum superconductors. In some embodiments, a uranium oxide layer can be created by exposing STS1 102, STS2 106, or both, to an oxidizing gas.

Though FIG. 1 has been described with a "top" layer, indicating a vertical alignment, Josephson Junction 100 can also be oriented in a horizontal manner. What the current invention requires in some embodiments is an insulating layer between two STS layers. In some embodiments, a Josephson junction may comprise one STS layer and one non-STS superconductor layer.

There are examples of known STS. These include $UTe_2$, URhGe, UIr, and UCoGe, among others which were discovered mostly from 1998-2007. While extensive past and current research has gone into investigating these STS for potential topological superconductivity, particularly $UTe_2$, no one to date has used these (or other) STS as a superconducting layer in a Josephson junction for quantum coherent devices. Indeed, the current body of research suggests that radioactive materials, such as uranium which is in most STS, would reduce the already low coherence times of superconducting qubits.

Figure 2:
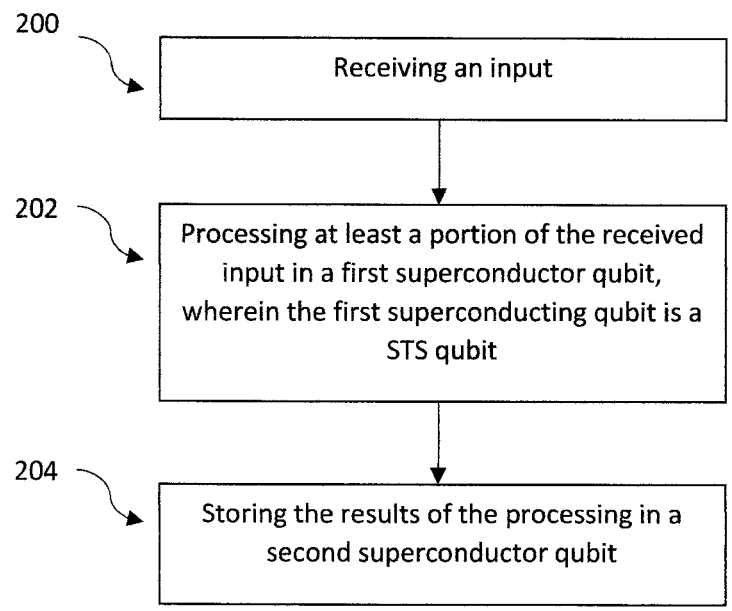
FIG. 2 is a block diagram of a method, in accordance with some embodiments of the present disclosure.

FIG. 2 is a flowchart of a method to process information in accordance with some embodiments. The method of FIG. 2 includes receiving an input in step 200, processing at least a portion of the received input in a first superconductor qubit, wherein the first superconductor qubit is a STS qubit in step 202; and storing the results of the processing in a second superconductor qubit in step 204. In some embodiments, the first superconductor qubit and the second superconductor qubit are physically adjacent to each other. In some embodiments, the second superconductor qubit is also a STS qubit. In some embodiments, the first superconductor qubit comprises a first STS layer, an insulating layer and a second STS layer that form a Josephson junction. In some embodiments, the first STS layer is made of UCoGe.

In some embodiments, a method includes providing a first superconductor layer, providing an insulating layer, and providing a second superconductor layer, wherein the first superconductor layer, the insulating layer, and the second superconductor layer form a Josephson junction and wherein one of the superconductor layers is a spin triplet superconducting layer. For example, the first superconductor layer in some embodiments is a STS layer. In some embodiments, the first superconductor layer includes UCoGe, and providing the insulating layer includes exposing the first superconductor layer to an oxidizing gas, such as air or atmosphere, in order to form uranium oxide. In some embodiments, the uranium oxide formation process may be assisted by heating. In some embodiments, the second superconductor layer is also a STS layer In some embodiments, a STS is used as a superconducting resonator or device in a quantum sensor. Current quantum sensors utilize superconductors in several components, such as a Josephson parametric amplifier, which lose their superconducting properties when a magnetic field is applied. However, many of the phenomena that these quantum sensors are looking for, such as dark matter, require a high magnetic field, which may be several Tesla (10000's of Oe). Since the magnetic field will cause a loss of superconducting properties in current quantum sensors' superconducting components such as a superconducting parametric amplifier, the magnetic field is applied in a resonating cavity made of a different material, such as copper or stainless steel. This results in the superconducting resonator or component, such as a signal amplifier, having to be physically separated from the cavity portion and magnetically shielded from the high magnetic fields.

Quantum sensors using a STS in accordance with some embodiments of the present invention require a different design from current quantum sensors using superconductors that lose their superconducting properties under a magnetic field. With STS, quantum sensors in accordance with some embodiments, the cavity and the superconducting resonator or component can be in the same location since the magnetic field will not destroy superconductivity. For example, a magnetic field can be applied directly to the superconducting resonator or component in a STS quantum sensor, and the STS resonator can be in the cavity or actually form the cavity itself. The shape and dimensions of the cavity will vary depending on what phenomenon the STS quantum sensor is looking for, but the magnetic field can be applied in the cavity regardless of the cavity's shape and dimension, and regardless of the STS resonator location.

In some embodiments, a STS is used in a signal amplifier, including parametric amplifiers. As discussed above, a quantum sensor may utilize a STS in a Josephson parametric amplifier in order to better sense a certain phenomenon. The STS Josephson parametric amplifier may also be used outside of sensor context, and used to amplify a signal of interest. Signals of interest may include, among others, a qubit readout. In some embodiments, a signal amplifier is made using multiple resonators, at least one of which includes a STS. There is at least one connection between the multiple resonators, such as two resonators connected in a cross, T or X shape. For example, in some embodiments, a Josephson ring modulator may be used to amplify a signal, wherein the Josephson ring modulator includes four Josephson junctions, with at least one Josephson junction being a STS Josephson junction.

In some embodiments, a STS may be used for a coplanar waveguide resonator. A coplanar waveguide may be comprised of three resonators placed in close proximity with each other, separated by a small gap between each resonator, and can transfer microwave frequencies.

Figure 3A:
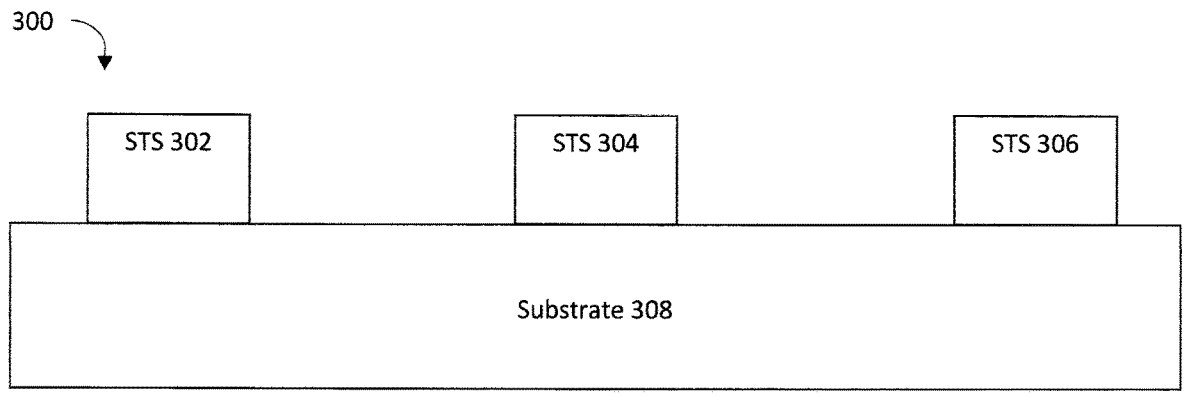
FIG. 3A is a diagram that illustrates a side view of a coplanar waveguide in accordance with some embodiments of the present disclosure.

FIG. 3A illustrates a side view of a coplanar waveguide in accordance with some embodiments. Coplanar Waveguide Resonator 300 includes Substrate 308, which is connected to STS 302, STS 304, and STS 306. Substrate 308, in some embodiments, may be made of non-doped silicon. STS 302, STS 304, and STS 306, in some embodiments, may made of UCoGe. The distance between STS 302 and STS 304 is the same as the distance between STS 304 and STS 306 in some embodiments, and can be called S. The width of STS 304 can also be called W. The ratio of W and S determines the characteristic impedance of the resonator.

Figure 3B:
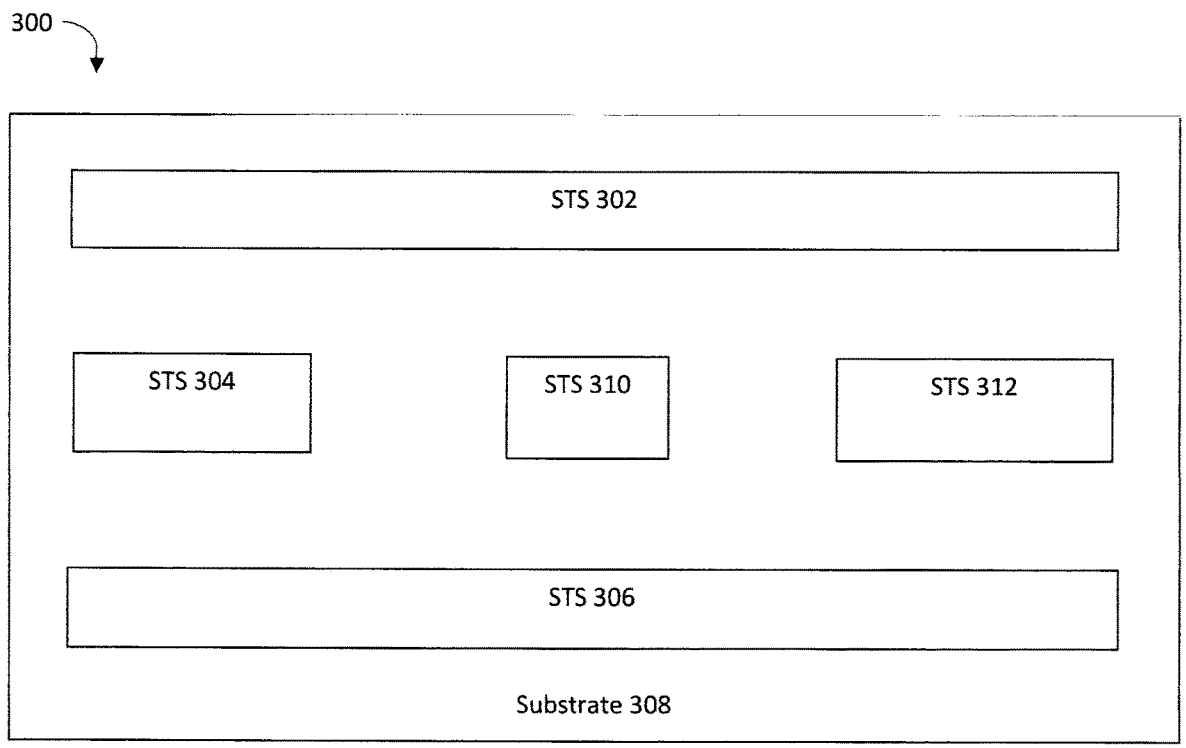
FIG. 3B is a diagram that illustrates a top view of a coplanar waveguide in accordance with some embodiments of the present disclosure.

FIG. 3B illustrates a top view of a coplanar waveguide in accordance with some embodiments. Coplanar Waveguide Resonator 300 includes Substrate 308, which is connected to STS 302, STS 304, STS 306, STS 310, and STS 312. The distance between STS 304 and STS 310 is the same as the distance between STS 310 and STS 312 in some embodiments. STS 302 or STS 306 may be grounded, in some embodiments.

Figure 4:
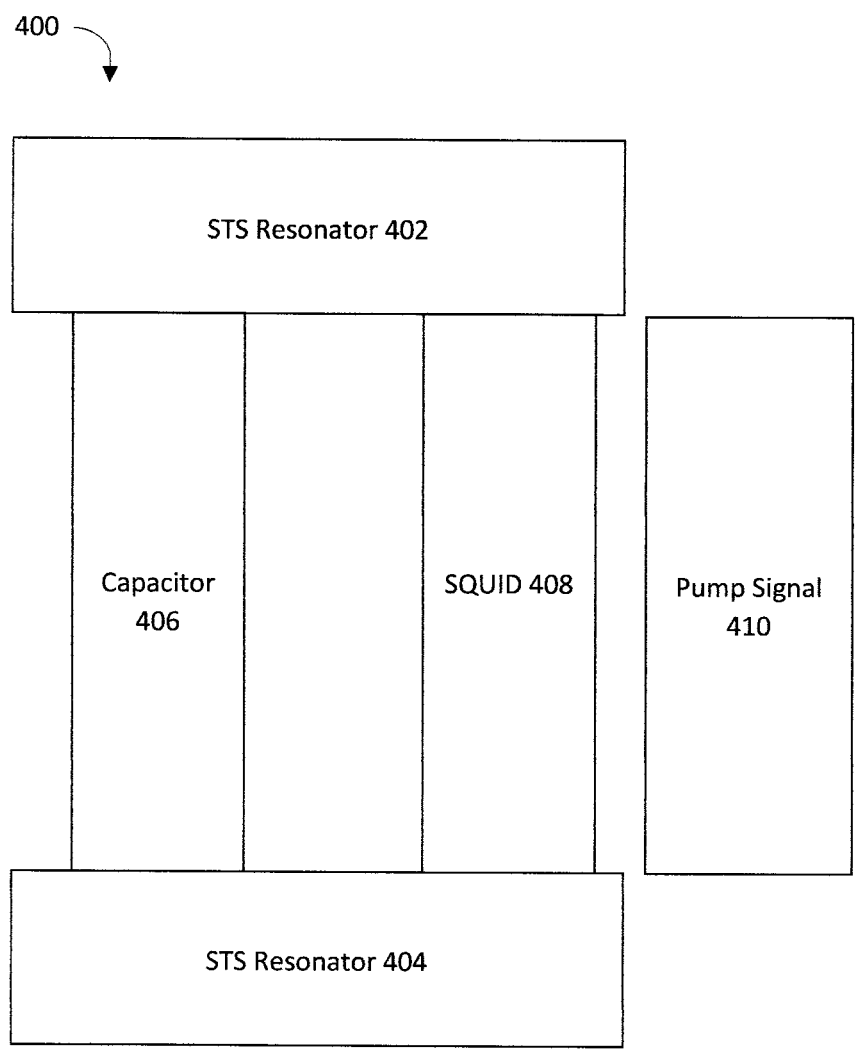
FIG. 4 is a diagram that illustrates a parametric amplifier in accordance with some embodiments.

FIG. 4 illustrates a Josephson parametric amplifier in accordance with some embodiments. Parametric Amplifier 400 includes STS Resonator 402, STS Resonator 404, Capacitor 406, SQUID 408, and Pump Signal 410. STS Resonator 402 is connected to STS Resonator 404 via Capacitor 406. Though FIG. 4 illustrates only one capacitor, in some embodiments, multiple capacitors may be placed between STS Resonator 402 and STS Resonator 404. Indeed, the number and spacing of capacitors between STS Resonator 402 and STS Resonator 404 affects the signal that is amplified. SQUID 408 is a superconducting quantum interference device, and may itself include one or more STS Josephson junctions (or Josephson junctions comprised of spin-singlet superconductors). Pump Signal 410 should be, in some embodiments, placed in close proximity to SQUID 408, but not in physical contact with SQUID 408, and may be used to boost an input signal on STS Resonator 402 in some embodiments.

In some embodiments, a STS is used as a quantum memory and quantum memory-interface. For example, a series of miniresonators may be connected to a wave guide resonator. In some embodiments, the miniresonators are spaced half a wavelength apart from each other and connected to a waveguide.

The terms "first," "second," "third," "fourth," etc., as used herein are meant as labels to distinguish among different elements and may not necessarily have an ordinal meaning according to their numerical designation.

The above description is intended to be illustrative, and not restrictive. Although the present disclosure has been described with references to specific illustrative examples, it will be recognized that the present disclosure is not limited to the examples described. The scope of the disclosure should be determined with reference to the following claims, along with the full scope of equivalents to which the claims are entitled.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. An apparatus, comprising:
   a first superconductor layer, wherein the first superconductor layer comprises UCoGe;
   an insulating layer; and
   a second superconductor layer, wherein the second superconductor layer comprises UCoGe, and wherein the first superconductor layer, the insulating layer, and the second superconductor layer form a Josephson junction.

2. The apparatus of claim 1, wherein the insulating layer includes uranium oxide.

3. The apparatus of claim 2, wherein the uranium oxide is created by exposing the second superconductor layer to an oxidizing gas.

* * * * *